United States Patent [19]
Lefeldt

[11] Patent Number: 5,530,365
[45] Date of Patent: Jun. 25, 1996

[54] PROCESS AND APPARATUS FOR LOCATING FAULTS IN CABLES, SUCH AS FAULTS IN UNDERGROUND CABLES

[75] Inventor: Ekkehard Lefeldt, Bornhöved, Germany

[73] Assignee: Hagenuk GmbH, Kiel, Germany

[21] Appl. No.: 325,698

[22] Filed: Oct. 19, 1994

[30] Foreign Application Priority Data

Oct. 21, 1993 [DE] Germany .................. 43 35 924.8

[51] Int. Cl.⁶ .................................................. G01R 31/08
[52] U.S. Cl. ........................ 324/536; 324/512; 324/527; 324/543
[58] Field of Search .................................. 324/512, 522, 324/523, 527, 531, 536, 543

[56] References Cited

U.S. PATENT DOCUMENTS

| 4,779,051 | 10/1988 | Grünewald et al. | ............. 324/536 |
| 5,272,439 | 12/1993 | Mashikian et al. | ............. 324/520 |

FOREIGN PATENT DOCUMENTS

| 3919497 | 12/1990 | Germany . |
| 4100305 | 7/1992 | Germany . |

Primary Examiner—Kenneth A. Wieder
Assistant Examiner—Glenn W. Brown
Attorney, Agent, or Firm—Nils H. Ljungman and Associates

[57] ABSTRACT

A process used to locate cable faults, in particular to locate non-burnout cable faults in the vicinity of branched cables. The pulse reflection method is used and a capacitor is charged and then discharged across a spark gap by means of spark-over at a fault in the cable. Simultaneously with a main capacitor in an impulse wave generator, a second pulse capacitor is discharged into the cable by means of a short circuit switch. The resulting reflection wave is input via a decoupler into a first channel of a digital storage unit. After opening the short circuit switch, the main capacitor in the impulse wave generator and the second pulse capacitor are again charged and then again discharged into the faulty cable by closing the main switch. The pulse capacitor is discharged by means of a plasma-triggered spark gap. The spark gap is triggered by the charge of the impulse wave generator. As a result of a delay in the formation of the plasma, the discharge pulse of the pulse capacitor reaches the fault location in the cable just after ignition. The resulting reflection wave, with no ignition delay, is input via the decoupler to a second channel of the digital storage unit. The fault location is determined by analyzing the differences between the two recordings.

13 Claims, 6 Drawing Sheets

FIG. 1
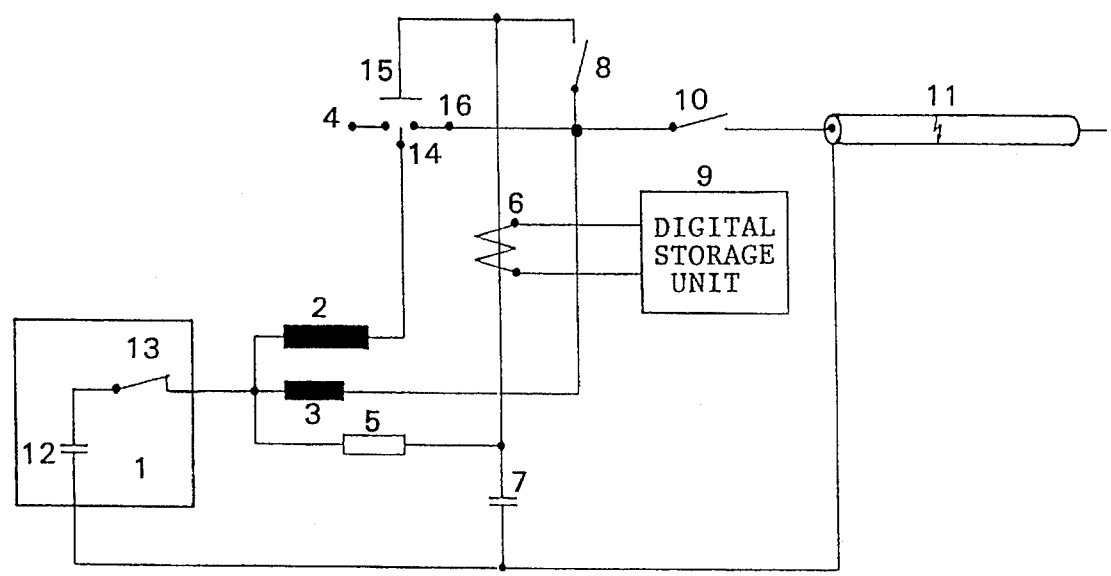
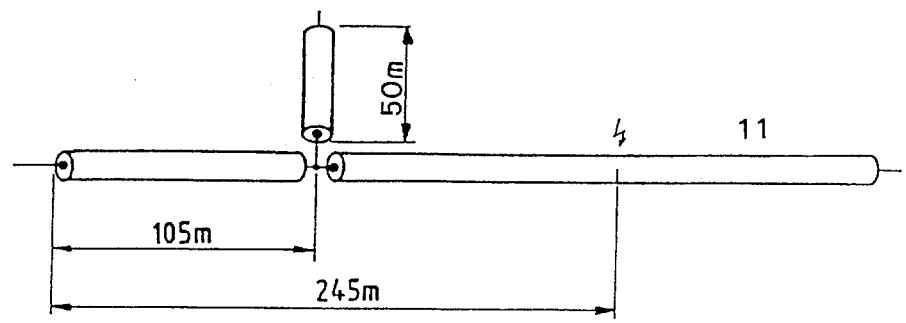
FIG. 2

PROCESS AND APPARATUS FOR LOCATING FAULTS IN CABLES, SUCH AS FAULTS IN UNDERGROUND CABLES

BACKGROUND OF THE INVENTION

1. Field of the Invention

The invention relates to a process for the location of cable faults, in particular for the location of non-burnout cable faults in the vicinity of branched cables, according to the pulse reflection method, in which a capacitor is charged and discharged across a spark gap by means of spark-over at a fault in the cable, and in which two measurements are superimposed in the vicinity of a digital storage unit to detect fault locations.

The invention also relates to an apparatus for the location of cable faults, in particular for the location of non-burnout cable faults in the vicinity of branched cables, according to the pulse reflection method, which apparatus has a rechargeable capacitor and a spark gap, connects the capacitor to the cable and has a digital storage unit for the recording and storage of two measurement curves.

2. Background Information

By means of such a process and such an apparatus, it is possible, in particular, to locate high and medium ohmic, non-burnout cable faults in an approximate manner. By discharging the capacitor across the spark gap, a reflection wave is generated in the vicinity of the cable fault, on the basis of which the distance to the fault can be determined.

In known arrangements, cable faults are located by means of high-voltage pulses from capacitor discharges and by displaying the reflection wave. The utility of this method is limited by the delay at the fault. Particularly, the propagation time, which is proportional to the distance to the fault location, can be extended to an unacceptable degree by the delay.

DE 41 00 305 A1 discloses a circuit configuration for the approximate location of high ohmic and intermittent cable faults using the pulse-echo method. An impulse wave generator together with a charging capacitor generates an impulse wave at a spark gap in air to strike a spark at the cable fault.

Additional methods of pulse location with high-voltage pulses are known, in which suitable pre-ionization of the fault renders the delay ineffective. Such methods are described in detail in the unexamined German patent specification DE 39 19 497.

Essentially, the object of unexamined patent specification DE 39 19 497 is a process in which the charge of a capacitor is connected to the faulty cable and an arc is produced at the fault location after the spark-over.

If the capacitor voltage is reduced to a certain value by the arc current, the remaining charge of the capacitor is discharged in pulses to the faulty cable by means of a short-circuit of the current limiting element, and the reflection wave thereby generated is input into a first channel of a digital storage unit to be recorded. Before or after this step, a reflection wave of a pulse voltage which is less than the trigger voltage, or ignition voltage of the fault, i.e., a reflection wave which does not trigger or ignite the fault, is input into a second channel of the digital storage unit to be recorded. The location of the fault is determined by superimposing the recordings of the two channels. This process is primarily suitable for high ohmic and intermittent faults.

On the other hand, medium ohmic faults, of the type which may occur if the fault is in water or in direct contact with damp ground, together with the current limiting element, form a voltage splitter which often reduces the voltage at the fault to such an extent that ignition no longer takes place. The voltage at the capacitor is therefore reduced by the current across the leakage resistance to the pulse ignition voltage without the fault having been ignited. The recordings in the digital storage unit thus contain essentially no information regarding the location of the fault.

Furthermore, known arrangements can tend to require a costly and complex apparatus for the rapid short-circuiting of the current limiting element. Sufficient auxiliary energy must generally be provided for the switching operation.

The capacitor of an impulse wave generator is used as the pulse capacitor. These capacitors are designed for high pulse energy density, but do not necessarily have a low self-inductance. The individual sub-capacitors are also designed so that they can be switched for multiple voltages. The connecting lines to the selector switch increase the effective inductance. In the interest of a highly accurate location of the fault, the rate of change of the pulse should be as high as possible, and therefore the inductance of the circuit should be kept as low as possible.

The capacitor disclosed in DE-OS 39 19 497 is used to generate both the arc and the pulse. Consequently, only a portion of the original voltage charge is available as the pulse voltage. This can be a disadvantage under difficult ignition, or breakdown, conditions.

OBJECT OF THE INVENTION

A first object of the present invention is therefore to improve a process of the type described above such that the accuracy with which the fault is located is increased.

A second object of the invention is an apparatus of the type described above which simplifies the approximate location of high and medium ohmic cable faults.

SUMMARY OF THE INVENTION

To achieve at least the first object, the invention teaches that a second pulse capacitor is preferably charged simultaneously with a main capacitor in an impulse wave generator, the main capacitor in the impulse wave generator is preferably discharged by means of a coil, and the pulse capacitor is preferably discharged by means of a connected short-circuiting switch into the faulty cable by closing a main switch, and the reflection wave thus generated is preferably input via a decoupler into a first channel of the digital storage unit to be recorded, and that, after opening the short-circuit switch, the main capacitor in the impulse wave generator and the second pulse capacitor are preferably again charged and again discharged into the faulty cable by closing the short circuit switch, whereby the pulse capacitor is preferably discharged across a plasma-triggered spark gap which is triggered via an ignition coil by the charge of the impulse wave generator, whereby, as a result of the delay in the formation of the plasma and deflection of the discharge pulse of the pulse capacitor, the fault location in the cable is reached just after ignition, and the reflection wave thus generated with no delay is preferably input via a decoupler into a second channel of the digital storage unit, and the location of the fault is preferably determined by analyzing the differences between the recordings and converting the respective pulse reflection times into distances.

To achieve at least the second object, the invention teaches that an impulse wave generator has a main capacitor with one terminal preferably connected directly to the cable and the other terminal preferably connected via a coil and a main switch to the cable, that a second pulse capacitor is preferably connected via a contact together with the main capacitor directly to the cable and can be connected via another contact, via a short circuit switch and the main switch to the cable, that a spark gap is preferably provided with a trigger electrode and a main electrode, whereby the trigger electrode is preferably connected to a connecting terminal of the main capacitor, the coil and a charging resistance by means of an ignition coil magnetically coupled to the coil, and the short circuit switch is preferably designed as the short circuit switch for the main electrodes, and that a digital storage unit is preferably connected via a decoupler to a feed line of the pulse capacitor, which line preferably connects the pulse capacitor to the cable.

Differing measurement curves can thus be generated which, by means of superimposition and evaluation of the signal differences, make possible a precise location of the cable fault. This process takes advantage of the fact that the pulse reflection propagation times are different, as a function of the respective breakdown condition of the cable.

In the event of a low leakage resistance of the cable and a resultant voltage splitting between the inductive resistance of the coil and the leakage resistance, which can result in the prevention of a fault ignition, a modification can be made whereby, with the short circuit switch closed, a reflection wave can preferably be input via the decoupler into the first channel of the digital storage unit to be recorded and the charging voltage of the impulse wave generator and the charging voltage of the pulse capacitor can preferably be subsequently increased to the maximum possible voltage and, with the short circuit switch closed, the capacitors can preferably be discharged into the faulty cable by closing the main switch, and the reflection wave can preferably be input via a coupling device into a second channel of the digital storage unit to be recorded, and the recordings of both channels can preferably be subsequently superimposed in such a manner that a point of difference between the two recordings detects a location which is more distant than the actual fault location, and that an additional relocation operation can preferably be performed toward one end of the cable.

To guarantee accurate location, the rate of change of the pulse can preferably be improved by means of a pulse capacitor with a low self-inductance. For this purpose, the pulse capacitor can preferably be designed coaxially, or at least be butted, or arranged face-to-face.

With a sufficiently high voltage of the impulse wave generator to guarantee a sure ignition of the spark gap, it is also possible for the ignition coil and the coil to be designed as a single component.

For appropriate electrical sizing, the charging resistance can preferably be sized so that, during a charging operation of the pulse capacitor, the voltage at the pulse capacitor follows the voltage at the main capacitor and that a sufficient electrical decoupling of the pulse capacitor and the main capacitor is realized during a rapid discharge operation.

When the word "invention" is used in this specification, the word "invention" includes "inventions", that is, the plural of "invention". By stating "invention", the applicant does not in any way admit that the present application does not include more than one patentably and non-obviously distinct invention, and maintains that this application may include more than one patentably and non-obviously distinct invention. The applicant hereby asserts that the disclosure of this application may include more than one invention, and in the event that there is more than one invention, that these inventions may be patentable and non-obvious one with respect to the other.

In summary, one aspect of the invention resides broadly in a method for determining the location of a fault in a cable, the method comprising the steps of: providing a circuit for providing a current for being propagated through a faulty cable; providing the circuit with means for being attached to the faulty cable; providing first means for discharging a first voltage into the faulty cable, the first discharging means comprising a capacitor; providing means for receiving and storing a first reflected wave from the faulty cable, the first reflected wave being generated in response to the discharge of the first voltage from the first discharging means; providing second means for discharging a second voltage into the faulty cable, the second discharging means comprising spark generation means; providing means for receiving and storing a second reflected wave from the faulty cable, the second reflected wave being generated in response to the discharge of the second voltage from the second discharging means; providing means for digitally comparing the first stored reflected wave and the second stored reflected wave to determine the location of the cable fault; the method further comprising the additional steps of: attaching the means for being attached to the faulty cable; discharging the first voltage into the faulty cable with the first discharging means; receiving and storing the first reflected wave from the faulty cable, the first reflected wave being generated in response to the discharge of the first voltage from the first discharging means; discharging the second voltage into the faulty cable with the second discharging means; receiving and storing the second reflected wave from the faulty cable, the second reflected wave being generated in response to the discharge of the second voltage from the second discharging means; and digitally comparing the first stored reflected wave and the second stored reflected wave to determine the location of the cable fault.

Another aspect of the invention resides broadly in apparatus for determining the location of a fault in a cable, the apparatus comprising: a circuit for providing a current for being propagated through a faulty cable; the circuit comprising means for being attached to the faulty cable; first means for discharging a first voltage into the faulty cable, the first discharging means comprising a capacitor; means for receiving and storing a first reflected wave from the faulty cable, the first reflected wave being generated in response to the discharge of the first voltage from the first discharging means; second means for discharging a second voltage into the faulty cable, the second discharging means comprising spark generation means; means for receiving and storing a second reflected wave from the faulty cable, the second reflected wave being generated in response to the discharge of the second voltage from the second discharging means; and means for digitally comparing the first stored reflected wave and the second stored reflected wave to determine the location of the cable fault.

BRIEF DESCRIPTION OF THE DRAWINGS

Embodiments of the invention are illustrated schematically in the accompanying drawings, wherein:

FIG. 1 shows a schematic circuit diagram with constituent electrical elements;

FIG. 2 shows, by way of example, a cable system with a 50 m long branch at a distance of 105 m and a fault distance of 245 m, with which reflection waves shown in FIGS. 3a–3e were recorded;

DESCRIPTION OF THE PREFERRED EMBODIMENT

Figure 3A:
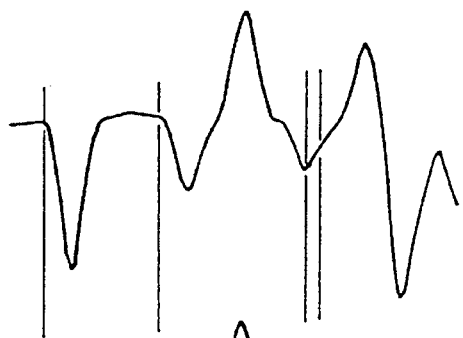
FIGS. 3a–3e show a series of different reflection waves as a function of respective circuit settings.

Together with the main capacitor (12) of an impulse wave generator (1), a pulse capacitor (7) is preferably charged via a charging resistance (5). The charging resistance (5) is preferably sized such that the voltage of the pulse capacitor (7) directly follows that of the main capacitor (12) in the impulse wave generator (1) during a slow charging operation, but is only negligibly recharged during the rapid discharge.

A short circuit switch (8) which short-circuits a plasma-triggered spark gap (4) preferably initially remains closed. When the main switch (10) is activated, the main capacitor (12) in the impulse wave generator (1) and the pulse capacitor (7), the latter with a rapid rate of change, are preferably discharged into a faulty cable (11).

The reflection wave is preferably input via a decoupler (6) into a first channel of a digital storage unit (9) to be recorded. The voltage of the impulse wave generator (1) and thus the voltage of the pulse capacitor (7) are preferably set just high enough to guarantee a spark-over at the fault. A reflection wave with a relatively long ignition delay is thus preferably recorded.

If the main switch (10) is activated when the short circuit switch (8) is open, the main capacitor (12) in the impulse wave generator (1) is preferably discharged via a coil (3) in the form of a damped oscillation after the ignition of the fault location in the cable (11). The peak voltage at the coil (3) preferably approximately corresponds to the charging voltage of the main capacitor (12) in the impulse wave generator (1). The coil (3) is preferably tightly coupled to an ignition coil (2). The voltage of the coil (3) can thus preferably be boosted for the ignition of a trigger electrode (14) of the plasma-triggered spark gap (4). The trigger electrode (14) preferably ignites. Plasma can be formed because the main capacitor (12) in the impulse wave generator (1), simultaneously with its discharge into the fault in the cable (11), now also preferably discharges via the coil (2) and the trigger electrode (14) in the spark gap (4). The plasma is preferably moved magnetically in the direction of the main electrode (15, 16) of the spark gap (4). This electrode preferably ignites and the pulse capacitor (7) preferably discharges into the faulty cable (11).

The plasma formation and movement preferably proceed relatively slowly, so that the main electrodes (15, 16) of the spark gap (4) preferably break down only approximately 1 millisecond after the ignition of the fault, i.e., the pulse discharge of the pulse capacitor (7) preferably finds the fault location ignited. The travelling wave has preferably decayed.

The reflection wave, which is now preferably directed from the decoupler (6) into a second channel of the digital storage unit (9) to be recorded, is preferably a reflection wave with no ignition delay.

By superimposing both recorded images, the corresponding fault location can preferably be indicated by the difference between the curves recorded, and the distance to the fault can be determined precisely. The pulse capacitor (7) should preferably be large enough that the pulse width is also sufficient for larger cable attenuations and fault distances. That can be the case at 1 to 2 microfarads.

A high degree of measurement accuracy can require a pulse with a high rate of change. The pulse capacitor (7) should preferably therefore have a low self-inductance, i.e., it should preferably be designed coaxially or at least be butted or end-bonded. In other words, in accordance with at least one preferred embodiment of the present invention, the pulse capacitor (7) can preferably be designed coaxially, or at least possibly be butted, end-bonded, end-contacted, or arranged face-to-face.

If there is no fault ignition due to the splitting of the voltage between the inductive resistance of the coil (3) and the leakage resistance of the faulty cable (11), there can essentially likewise possibly be no ignition of the spark gap (4) due to the significantly lesser drop in voltage at the coil (2). The pulse capacitor (7) is essentially not discharged and essentially no reflection wave is generated.

In this case, a less accurate but still usable location of the fault can be determined by increasing the voltage of the main capacitor (12), the impulse wave generator (1) and the voltage of the pulse capacitor (7) to the maximum possible or to the maximum authorized voltage for the cable system in question.

If the main switch (10) is now activated with the short circuit switch (8) closed, a reflection wave with a smaller ignition delay can be recorded in the second channel of the digital storage unit (9). If this recording is superimposed—possibly with a reduced amplification—on the reflection wave with a longer ignition delay recorded in the first channel of the digital storage unit (9), the fault location can be indicated at a distance which is possibly greater than the actual distance. However, the measurement error can be minimized by means of the process described. A relocation procedure can be conducted from the fault location determined as described above, toward the originating end of the cable.

In accordance with at least one preferred embodiment of the present invention, impulse wave generator 1 may preferably include a switch 13 above the upper terminal of capacitor 12, that is, between capacitor 12 and the junction leading to ignition coil 2, coil 3 and charging resistance 5.

The cable arrangement illustrated in FIG. 2 is provided as an example and can, according to at least one preferred embodiment of the present invention, represent a basis for the reflection waves shown in FIGS. 3a–3e. The cable arrangement shown in FIG. 2 has a 50 m long branch at a distance of 105 m, and a fault distance of 245 m. In accordance with at least one preferred embodiment of the present invention, the distances of 105 m and 245 m can be considered as having been measured from a common reference point, which common reference point could preferably be the point of attachment of cable 9 to the circuit described herein.

FIG. 3a represents the recording of a reflection wave with the short circuit switch (8) closed and a relatively large ignition delay. The reflection of the branch after 105 m is visible. Because of the long ignition delay, the actual fault reflection lies outside the displayed area.

Figure 3B:
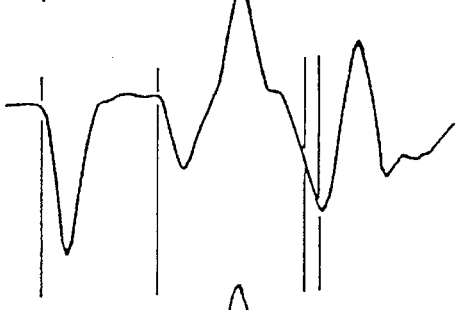
Figure 3C:
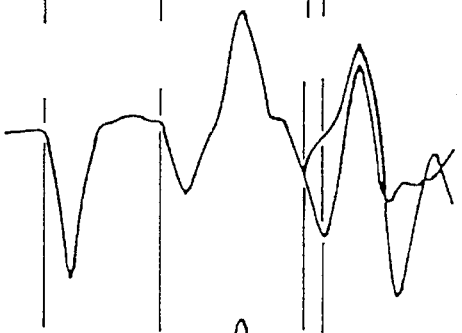

The curve in FIG. 3b is the recording of a reflection wave with no firing delay. This is therefore a pulse discharge of the pulse capacitor (7) across the plasma-triggered spark gap (4) with the short circuit switch (8) open. The branch reflections do not permit a clear determination of fault location here, either. FIG. 3c shows a superimposition of the curves in FIGS. 3a and 3b. The fault location is clearly indicated as the divergence at a distance of approximately 245 m from the feed point.

Figure 3D:
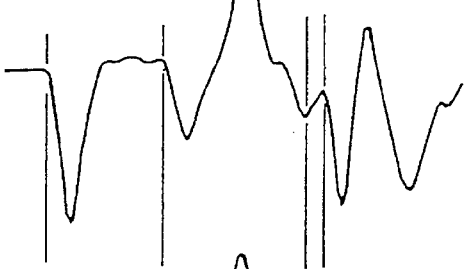
Figure 3E:
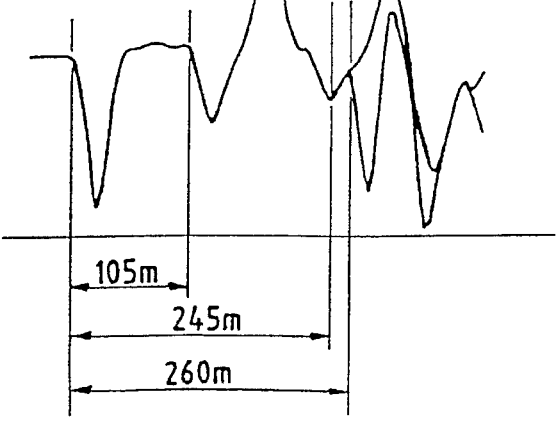

FIG. 3d represents the recording of a delayed-firing reflection wave for which the impulse wave voltage was increased to the maximum impulse wave voltage authorized for the cable system. The superimposition of the curves in FIGS. 3a and 3d is essentially represented in FIG. 3e. The fault can now be located at a distance of 260 m. It was thus essentially measured at a point 15 m too far.

It will be appreciated that the present invention may be utilized with several types of cables, including the following: microwave cables, transmission lines, telephone cables, and coaxial cables; any cables such as these located either overhead or underground.

In accordance with at least one preferred embodiment of the present invention, decoupler 6 could preferably be embodied by, for example, a transducer or signal transformer, possibly in the form of a loop around the wire constituting the connection between pulse capacitor 7 and short-circuit switch 8. As such, the decoupler 6 may suitably accept the reflected waveforms discussed heretofore by sensing the current through said wire, via a voltage induced in the loop by the current.

Figure 4:
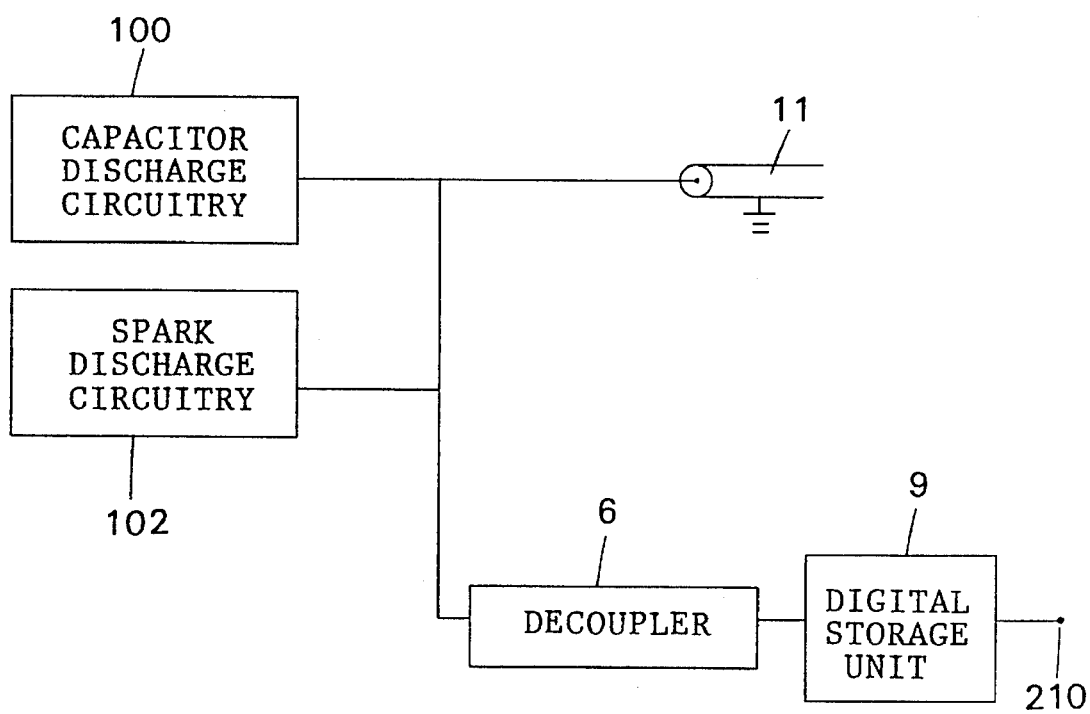
FIG. 4 shows a general schematic block diagram of a circuit which may be employed in accordance with the present invention.

FIG. 4 shows a general schematic block diagram of a circuit which may be employed in accordance with the present invention. Particularly, FIG. 4 illustrates that, in accordance with at least one preferred embodiment of the present invention, capacitor discharge circuitry 100 (the composition of which will be apparent from the disclosure heretofore) may be used to generate a first reflection wave from cable 11, and spark discharge circuitry (the composition of which will also be apparent from the disclosure heretofore) may be used to generate a second reflection wave from cable 11, whereby both reflection waves can preferably be sent, via decoupler 6, to digital storage unit 9. As will be discussed herebelow, digital storage unit 9 may preferably include an output portion 210.

Figure 5:
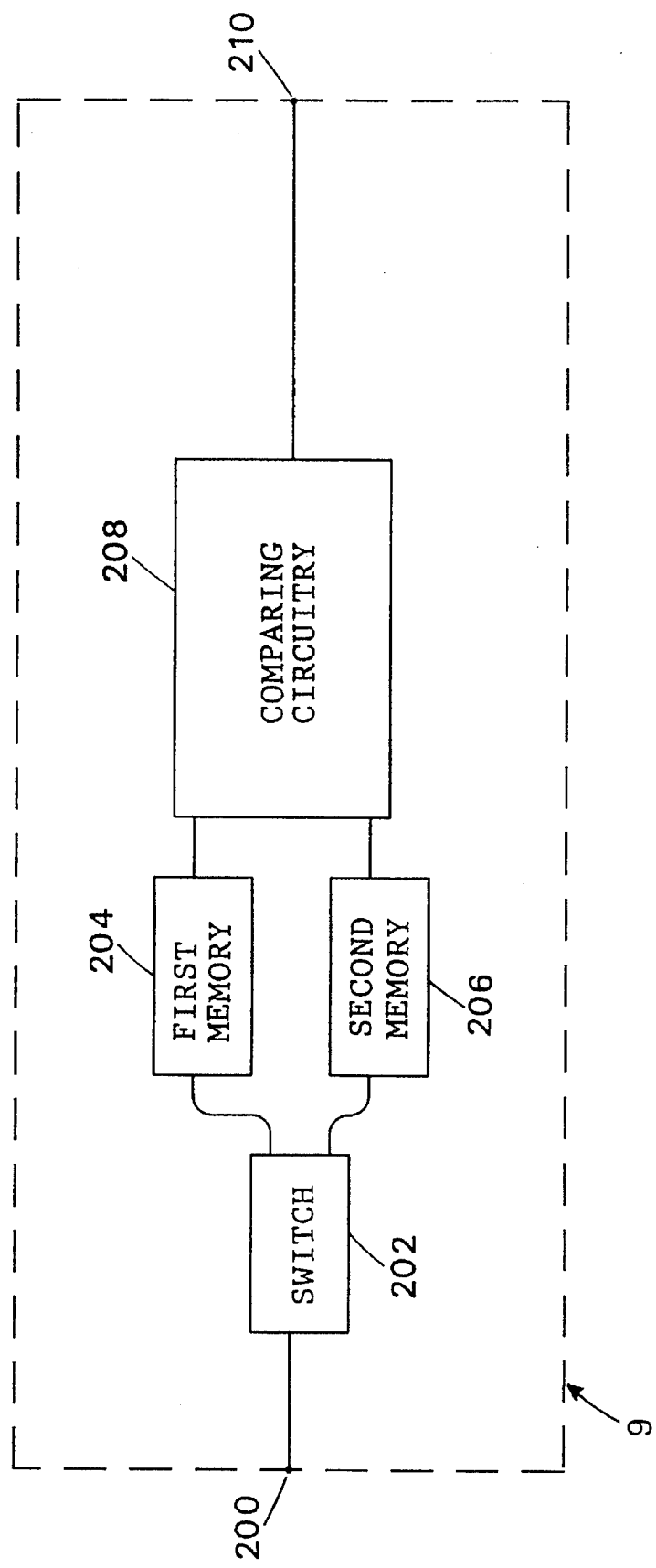
FIG. 5 shows a general schematic block diagram of a digital storage unit which may be utilized in accordance with the present invention.

FIG. 5 shows a general schematic block diagram of a digital storage unit 9 which may be utilized in accordance with the present invention. Particularly, a digital storage unit 9 may include an input portion 200 leading to a switch 202. Preferably, switch 202 can selectively input a reflection wave into either a first memory 204 or a second memory 206, wherein the first memory 204 could preferably correspond to the "first channel" described heretofore, and the second memory 206 could preferably correspond to the "second channel" described heretofore. Preferably, the first memory 204 and second memory 206 could each input their constituent stored reflection waves into comparing circuitry 208. Preferably, comparing circuitry 208 could be configured to undertake the numerical manipulations of the waves described heretofore and output desired information to an output portion 210. Preferably, output portion 210 could be connected to a suitable display device, memory device, or other device intended for receiving the output of the comparing circuitry 208.

Figure 6:
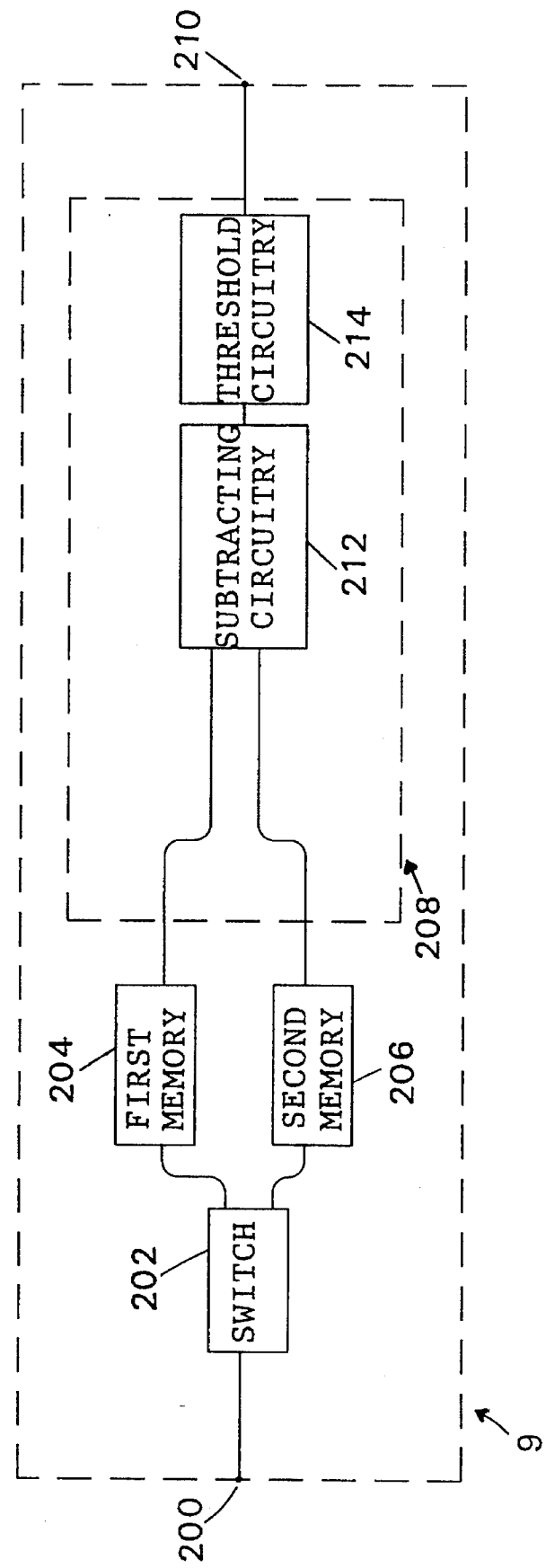
FIG. 6 shows a schematic block diagram of one possible digital storage unit, having the basic elements shown in FIG. 5, which may be utilized in accordance with the present invention.

FIG. 6 shows a schematic block diagram of one possible digital storage unit 9, having the basic elements shown in FIG. 5, which may be utilized in accordance with the present invention. Particularly, FIG. 6 illustrates that comparing circuitry 208 may preferably include subtracting circuitry 212 and threshold circuitry 214. Thus, in accordance with at least one preferred embodiment of the present invention, subtracting circuitry 212 could preferably be configured to perform a subtraction function on the two reflection waves stored in the first and second memories 204, 206, and, in conjunction with suitable threshold circuitry 214, could preferably provide a result corresponding to the location of the cable fault.

Figure 7:
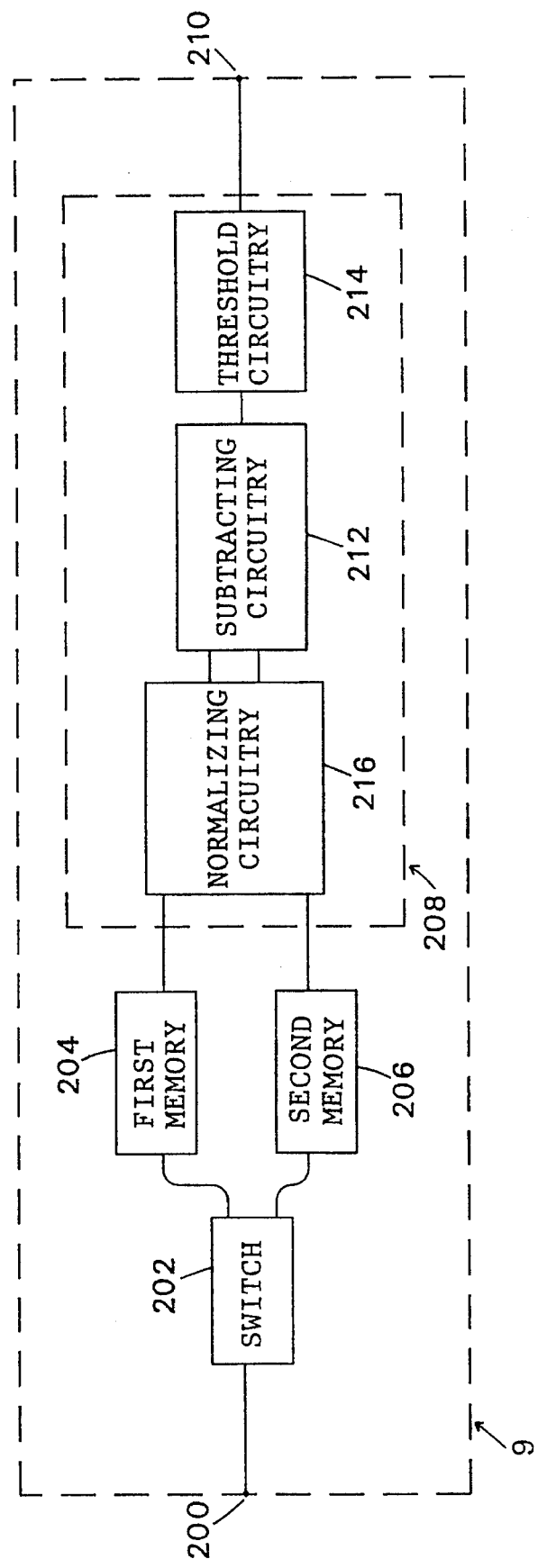
FIG. 7 shows a schematic block diagram of another possible digital storage unit, having the basic elements shown in FIG. 5, which may be utilized in accordance with the present invention.

FIG. 7 shows a schematic block diagram of another possible digital storage unit 9, having the basic elements shown in FIG. 5, which may be utilized in accordance with the present invention. The comparing circuitry 208 shown in FIG. 7 has essentially the same elements as the comparing circuitry shown in FIG. 6, with the addition of normalizing circuitry 216. In accordance with at least one preferred embodiment of the present invention, normalizing circuitry 216 may preferably be configured so as to normalize one or more components of the reflection waves stored in the first and second memories 204, 206, prior to manipulation of the waveforms in subtracting circuitry 212. For example, normalizing circuitry 216, if desired, could conceivably normalize the amplitudes of the waveforms stored in first and second memories 204, 206.

One feature of the invention resides broadly in the process for the location of cable faults, in particular the location of non-burnout cable faults in the vicinity of branched cables, according to the pulse reflection method in which a capacitor is charged and discharged across a spark gap by means of spark-over at a fault in the cable, and in which two measurements are superimposed in the vicinity of a digital storage unit to detect fault locations, characterized by the fact that a second pulse capacitor 7 is charged simultaneously with a main capacitor 12 in an impulse wave generator 1 and the main capacitor 12 in the impulse wave generator 1 is discharged via a coil 3 and the pulse capacitor 7 is discharged into the faulty cable 11 across a connected short circuit switch 8 by closing a main switch 10, and the reflection wave thus generated is input via a decoupler 6 into a first channel of the digital storage unit 9 to be recorded, and that after opening the short circuit switch 8, the main capacitor 12 in the impulse wave generator 1 and the second pulse capacitor 7 are again charged and again discharged into the faulty cable 11 by closing the main switch 10, whereby the pulse capacitor 7 is discharged via a plasma-triggered spark gap 4 which is triggered via a coil 2 by the charge of the impulse wave generator 1, whereby, by means of a delay in the formation of the plasma and deflection of the discharge pulse from the pulse capacitor 7, the fault location in the cable 11 is reached after firing, and the reflection wave thus generated with no firing delay is input via a decoupler 6 into a second channel of the digital storage unit 9, and that the respective pulse reflection times are converted into distances and the fault location is determined by means of an analysis of the differences between the recordings.

Another feature of the invention resides broadly in the process characterized by the fact that, with the short circuit switch 8 closed, a reflection wave is input via a decoupler 6 into a first channel of the digital storage device 9 to be recorded, and the charging voltage of the impulse wave generator 1 and the charging voltage of the pulse capacitor 7 are subsequently increased to the maximum possible voltage and, with the short circuit switch 8 closed, the capacitors 7, 12 are discharged by into the faulty cable 11 by closing the main switch 10, and that the reflection wave is input via the decoupler 6 into a second channel of the digital storage unit 9 to be recorded, and the recordings of the two channels are subsequently superimposed on one another so that the difference between the two recordings is an indication of a location which is more distant than the actual location of the fault, and that an additional relocation is conducted toward one of the cable ends.

Yet another feature of the invention resides broadly in the apparatus for the location of cable faults, in particular for the location of non-burnout cable faults in the vicinity of branched cables, according to the pulse reflection method, which apparatus has a chargeable capacitor and a spark gap, connects the capacitor to the cable and has a digital storage unit for the recording and storage of two measurement curves, characterized by the fact that an impulse wave generator 1 has a main capacitor 12 with one terminal connected directly to the cable 11 and the other terminal connected via a coil 3 and a main switch 10 to the cable 11, that a second pulse capacitor 7 is connected via a contact together with the main capacitor 12 directly to the cable 11 and is connected via another contact, a short circuit switch 8 and the main switch 10 to the cable, that a spark gap 4 has a trigger electrode 14 and a main electrode 15, 16, whereby the trigger electrode 14 is connected to a connecting terminal of the main capacitor 12, the coil 3 and a charging resistance 5 by means of an ignition coil 2 magnetically coupled to the coil 3 and the short circuit switch 8 is designed as the short circuit switch 8 for the main electrodes 15, 16, and that a digital storage unit 9 is connected via a decoupler 6 to a feed line of the pulse capacitor 7, which line connects the pulse capacitor 7 to the cable 11.

Still another feature of invention resides broadly in the apparatus characterized by the fact that the pulse capacitor 7 has a low self-inductance.

A further feature of the invention resides broadly in the apparatus characterized by the fact that the ignition coil 2 and the coil 3 are designed as a single component.

Another feature of the invention resides broadly in the apparatus characterized by the fact that the charging resistance 5 is sized so that, during a charging operation of the pulse capacitor 7, the voltage at the pulse capacitor 7 follows the voltage at the main capacitor 12 and that a sufficient electrical decoupling of the pulse capacitor 7 and the main capacitor 12 is realized during a rapid discharge operation.

Examples of digital storage unit arrangements or the like, which may be utilized in accordance with the embodiments of the present invention, may be found in the following U.S. Pat. No. 5,179,295, which issued to Mattison et al. on Jan. 12, 1993; No. 5,257,220, which issued to Shin et al. on Oct. 26, 1993; and No. 5,272,439, which issued to Mashikian et al. on Dec. 21, 1993.

Examples of digital wave samplers, which may be utilized in accordance with the embodiments of the present invention, may be found in the following U.S. Pat. No. 5,194,907, which issued to Hayashi on Mar. 16, 1993; and No. 5,321,273, which issued to Mizoguchi on Jun. 14, 1994.

Examples of normalizing units, devices or circuitry, which may be utilized in accordance with the embodiments of the present invention, may be found in the following U.S. Pat. No. 5,184,316, which issued to Sugiyama on Feb. 2, 1993; and No. 5,195,045, which issued to Keane et al. on Mar. 16, 1993.

Examples of subtracting units, devices or circuitry, which may be utilized in accordance with the embodiments of the present invention, may be found in the following U.S. Pat. No. 5,196,786, which issued to Usami et al. on Mar. 23, 1993; No. 5,226,328, which issued to Petroff et al. on Jul. 13, 1993; No. 5,319,311, which issued to Kawashima et al. on Mar. 12, 1992; and No. 5,332,901, which issued to Eckles, et al. on Jul. 26, 1994.

Examples of threshold units, devices or circuitry, which may be utilized in accordance with the embodiments of the present invention, may be found in the following U.S. Pat. No. 5,220,922, which issued to Barany on Jun. 22, 1993; No. 5,226,328, which issued to Petroff et al. on Jul. 13, 1993; No. 5,241,962, which issued to Iwama on Sep. 7, 1993; and No. 5,289,391, which issued to Ibrahim et al. on Feb. 22, 1994.

Examples of cable arrangements, which may be utilized in accordance with the embodiments of the present invention, may be found in the following U.S. Pat. No. 5,272,439, which issued to Mashikian et al. on Dec. 21, 1993; No. 5,319,311, which issued to Kawashima et al. on Jun. 7, 1994; No. 5,210,497, which issued to Regini on May 11, 1993; No. 5,218,307, which issued to Hiller on Jun. 8, 1993; and No. 5,282,237, which issued to Babu et al. on Jan. 25, 1994.

Examples of spark arrangements, including plasma spark arrangements, which may be utilized in accordance with the embodiments of the present invention, may be found in the following U.S. Pat. No. 5,183,956, which issued to Rosenberg on Feb. 2, 1993; No. 5,222,993, which issued to Crane on Jun. 29, 1993; No. 5,297,510, which issued to Turkowski on Mar. 29, 1993.

Examples of impulse wave generator arrangements, which may be utilized in accordance with the embodiments of the present invention, may be found in the following U.S. Pat. No. 5,248,958, which issued to Milin on Sep. 28, 1993; No. 5,333,136, which issued to Ahn on Jul. 26, 1994.

Examples of pulse capacitor arrangements, which may be utilized in accordance with the embodiments of the present invention, may be found in the following U.S. Pat. No. 5,305,339, which issued to Nakatani et al. on Apr. 19, 1994; No. 5,201,865, which issued to Kuehn on Apr. 13, 1993; No. 5,218,523, which issued to Sugishima on Jun. 8, 1993; No. 5,291,534, which issued to Sakurai on Mar. 1, 1994; No. 5,312,444, which issured to Bocek et al. on May 17, 1994.

Example of charge resistor/resistance arrangements, which may be utilized in accordance with the embodiments of the present invention, may be found in the following U.S. Pat. No. 5,210,471, which issued to Nuckolls et al. on May 11, 1993; No. 5,216,567, which issued to Konstanzer on Jun. 1, 1993.

All, or substantially all, of the components and methods of the various embodiments may be used with at least one embodiment or all of the embodiments, if any, described herein.

All of the patents, patent applications and publications recited herein, and in the Declaration attached hereto, are hereby incorporated by reference as if set forth in their entirety herein.

The corresponding foreign patent publication applications, namely, Federal Republic of Germany Patent Application No. P 43 35 924.8, filed on Oct. 21, 1993, having inventor Ekkehard Lefeldt, and DE-OS P 43 35 924.8 and DE-PS P 43 35 924.8, as well as their published equivalents, and other equivalents or corresponding applications, if any, in corresponding cases in the Federal Republic of Germany and elsewhere, and the references cited in any of the documents cited herein, are hereby incorporated by reference as if set forth in their entirety herein.

The details in the patents, patent applications and publications may be considered to be incorporable, at applicant's option, into the claims during prosecution as further limitations in the claims to patentably distinguish any amended claims from any applied prior art.

The appended drawings in their entirety, including all dimensions, proportions and/or shapes in at least one embodiment of the invention, are accurate and to scale and are hereby included by reference into this specification.

The invention as described hereinabove in the context of the preferred embodiments is not to be taken as limited to all of the provided details thereof, since modifications and variations thereof may be made without departing from the spirit and scope of the invention.

What is claimed is:

1. Method for determining the location of a fault in a cable, said method comprising the steps of:

providing a circuit for providing a current for being propagated through a faulty cable;

providing the circuit with means for being attached to the faulty cable;

providing first means for discharging a first voltage into the faulty cable, the first discharging means comprising a capacitor;

providing means for receiving and storing a first reflected wave from the faulty cable, the first reflected wave being generated in response to the discharge of the first voltage from the first discharging means;

providing second means for discharging a second voltage into the faulty cable, the second discharging means comprising spark generation means;

providing means for receiving and storing a second reflected wave from the faulty cable, the second reflected wave being generated in response to the discharge of the second voltage from the second discharging means;

providing means for digitally comparing the first stored reflected wave and the second stored reflected wave to determine the location of the cable fault;

said method further comprising the additional steps of:

attaching the means for being attached to the faulty cable;

discharging the first voltage into the faulty cable with the first discharging means;

receiving and storing the first reflected wave from the faulty cable, the first reflected wave being generated in response to the discharge of the first voltage from the first discharging means;

discharging the second voltage into the faulty cable with the second discharging means;

receiving and storing the second reflected wave from the faulty cable, the second reflected wave being generated in response to the discharge of the second voltage from the second discharging means; and digitally comparing the first stored reflected wave and the second stored reflected wave to determine the location of the cable fault.

2. The method according to claim 1, comprising a process for the location of cable faults, in particular the location of non-burnout cable faults in the vicinity of branched cables, according to the pulse reflection method in which a capacitor is charged and discharged across a spark gap by means of spark-over at a fault in the cable, and in which two measurements are superimposed in the vicinity of a digital storage unit to detect fault locations, wherein:

said circuit comprises an impulse wave generator;

said capacitor comprises a main capacitor;

said second discharging means comprises a second pulse capacitor;

said means for digitally comparing comprises a digital storage unit;

said means for receiving and storing a first reflected wave comprises a first channel of said digital storage unit;

said second pulse capacitor is charged simultaneously with said main capacitor in an impulse wave generator, and the main capacitor in the impulse wave generator is discharged via a coil and the pulse capacitor is discharged into the faulty cable across a connected short circuit switch by closing a main switch, the reflection wave thus generated, being said first reflected wave, is input via a decoupler into the first channel of the digital storage unit in order to be recorded, said spark generation means comprises a plasma-triggered spark gap;

said means for receiving and storing a second reflected wave comprises a second channel of said digital storage unit;

after opening the short circuit switch, the main capacitor in the impulse wave generator and the second pulse capacitor are again charged and again discharged into the faulty cable by closing the main switch, whereby the second pulse capacitor is discharged via said plasma-triggered spark gap, said plasma-triggered spark gap being triggered via a coil by the charge of the impulse wave generator, whereby, by means of a delay in the formation of the plasma and deflection of the discharge pulse from the second pulse capacitor, the fault location in the cable is reached after firing, the reflection wave thus generated with no firing delay is input via a decoupler into the second channel of the digital storage unit, and the respective pulse reflection times are converted into distances and the fault location is determined by means of an analysis of the differences between the recordings.

3. Process as claimed in claim 2, characterized by the fact that, with the short circuit switch (8) closed, a reflection wave is input via a decoupler (6) into a first channel of the digital storage device (9) to be recorded, and the charging voltage of the impulse wave generator (1) and the charging voltage of the second pulse capacitor (7) are subsequently increased to the maximum possible voltage and, with the short circuit switch (8) closed, the main capacitor (12) and second pulse capacitor (7) are discharged into the faulty cable (11) by closing the main switch (10), and that the reflection wave is input via the decoupler (6) into a second channel of the digital storage unit (9) to be recorded, and the recordings of the two channels are subsequently superimposed on one another so that the difference between the two recordings is an indication of a location which is more distant than the actual location of the fault, and that an additional relocation is conducted toward one of the cable ends.

4. Process as claimed in claim 3, wherein:
   said coil for discharging the main capacitor (12) is a coil (3); and
   said spark gap is a spark gap (4).

5. Apparatus for determining the location of a fault in a cable, said apparatus comprising:
   a circuit for providing a current for being propagated through a faulty cable;
   said circuit comprising means for being attached to the faulty cable;
   first means for discharging a first voltage into the faulty cable, said first discharging means comprising a capacitor;
   means for receiving and storing a first reflected wave from the faulty cable, said first reflected wave being generated in response to the discharge of the first voltage from said first discharging means;
   second means for discharging a second voltage into the faulty cable, said second discharging means comprising spark generation means;
   means for receiving and storing a second reflected wave from the faulty cable, the second reflected wave being generated in response to the discharge of the second voltage from said second discharging means; and
   means for digitally comparing the first stored reflected wave and the second stored reflected wave to determine the location of the cable fault.

6. Apparatus according to claim 5, for the location of cable faults, in particular for the location of non-burnout cable faults in the vicinity of branched cables, according to the pulse reflection method, which apparatus has a chargeable capacitor and a spark gap, connects the capacitor to the cable and has a digital storage unit for the recording and storage of two measurement curves, wherein:
   said circuit comprises an impulse wave generator;
   said capacitor comprises a main capacitor;
   said second discharging means comprises a second pulse capacitor;
   said impulse wave generator has said main capacitor, with one terminal connected directly to the cable and the other terminal connected via a coil and a main switch to the cable,
   said second pulse capacitor is connected via a contact together with the main capacitor directly to the cable and is connected via another contact, a short circuit switch and the main switch to the cable,
   said spark-generation means comprises a spark gap;
   said spark gap has a trigger electrode and main electrodes, whereby the trigger electrode is connected to a connecting terminal of the main capacitor, the coil and a charging resistance by means of an ignition coil magnetically coupled to the coil;
   the short circuit switch is designed as the short circuit switch for the main electrodes, and
   said means for digitally comparing comprises a digital storage unit being connected via a decoupler to a feed line of the pulse capacitor, which line connects the pulse capacitor to the cable.

7. Apparatus as claimed in claim 6, characterized by the fact that the charging resistance (5) is sized so that, during a charging operation of the pulse capacitor (7), the voltage at the pulse capacitor (7) follows the voltage at the main capacitor (12) and that a sufficient electrical decoupling of the pulse capacitor (7) and the main capacitor (12) is realized during a rapid discharge operation.

8. Apparatus as claimed in claim 6, characterized by the fact that the ignition coil (2) and the coil (3) are designed as a single component.

9. Apparatus as claimed in claim 8, characterized by the fact that the charging resistance (5) is sized so that, during a charging operation of the pulse capacitor (7), the voltage at the pulse capacitor (7) follows the voltage at the main capacitor (12) and that a sufficient electrical decoupling of the pulse capacitor (7) and the main capacitor (12) is realized during a rapid discharge operation.

10. Apparatus as claimed in claim 6, characterized by the fact that the pulse capacitor (7) has a low self-inductance.

11. Apparatus as claimed in claim 10, characterized by the fact that the charging resistance (5) is sized so that, during a charging operation of the pulse capacitor (7), the voltage at the pulse capacitor (7) follows the voltage at the main capacitor (12) and that a sufficient electrical decoupling of the pulse capacitor (7) and the main capacitor (12) is realized during a rapid discharge operation.

12. Apparatus as claimed in claim 10, characterized by the fact that the ignition coil (2) and the coil (3) are designed as a single component.

13. Apparatus as claimed in claim 12, characterized by the fact that the charging resistance (5) is sized so that, during a charging operation of the pulse capacitor (7), the voltage at the pulse capacitor (7) follows the voltage at the main capacitor (12) and that a sufficient electrical decoupling of the pulse capacitor (7) and the main capacitor (12) is realized during a rapid discharge operation.

* * * * *